(12) United States Patent
Ito

(10) Patent No.: US 11,209,460 B2
(45) Date of Patent: Dec. 28, 2021

(54) ELECTRICAL CONNECTION DEVICE WITH A SHORT-CIRCUIT WIRING PATTERN THAT REDUCES CONNECTION WIRINGS

(71) Applicant: Kabushiki Kaisha Nihon Micronics, Tokyo (JP)

(72) Inventor: Tatsuya Ito, Aomori (JP)

(73) Assignee: Kabushiki Kaisha Nihon Micronics, Musashino (JP)

( * ) Notice: Subject to any disclaimer, the term of this patent is extended or adjusted under 35 U.S.C. 154(b) by 70 days.

(21) Appl. No.: 16/604,544

(22) PCT Filed: Apr. 3, 2018

(86) PCT No.: PCT/JP2018/014249
§ 371 (c)(1),
(2) Date: Oct. 10, 2019

(87) PCT Pub. No.: WO2018/190195
PCT Pub. Date: Oct. 18, 2018

(65) Prior Publication Data
US 2020/0124640 A1    Apr. 23, 2020

(30) Foreign Application Priority Data

Apr. 13, 2017  (JP) .............................. JP2017-079748

(51) Int. Cl.
*G01R 1/07*        (2006.01)
*G01R 1/073*       (2006.01)
*G01R 31/28*       (2006.01)

(52) U.S. Cl.
CPC ..... *G01R 1/07307* (2013.01); *G01R 31/2818* (2013.01); *G01R 31/2863* (2013.01)

(58) Field of Classification Search
CPC ............ G01R 1/07357; G01R 1/07314; G01R 1/07371; G01R 1/07342; G01R 1/06772;
(Continued)

(56) References Cited

U.S. PATENT DOCUMENTS 5,534,784 A * 7/1996 Lum ................... G01R 1/07378
324/754.03
5,635,846 A * 6/1997 Beaman ............. G01R 1/07307
257/E23.067
(Continued)

FOREIGN PATENT DOCUMENTS

CN    103884874 A    6/2014
JP    2005134285 A   5/2005
(Continued)

*Primary Examiner* — Vinh P Nguyen
(74) *Attorney, Agent, or Firm* — Lorenz & Kopf, LLP

(57) ABSTRACT

An electrical connection device includes: a plurality of probes (10) in which distal end portions contact an inspection object (2) during measurement; and a space transformer (30) including a plurality of connection wirings (33), in each of which a first terminal electrically connected to any of proximal end portions of the plurality of probes (10) is arranged on a first main surface (301), and a second terminal is exposed to a second main surface (302), and having a short-circuit wiring pattern formed on the first main surface, the short-circuit wiring pattern electrically connecting, to the same connection wiring (33), proximal end portions of a plurality of same-potential probes (10) set at a same potential during measurement among the plurality of probes (10).

8 Claims, 5 Drawing Sheets

(58) Field of Classification Search
CPC ............ G01R 1/07307; G01R 31/2886; G01R
1/06738; G01R 1/0491; G01R 1/06727;
G01R 1/06744; G01R 1/0675; G01R
1/07364; G01R 1/073; G01R 1/0735;
G01R 1/06711; G01R 1/06722; G01R
31/26; G01R 31/2887; G01R 1/0408;
G01R 31/2896; G01R 1/06705; G01R
1/06794; G01R 1/07328; G01R 31/2818;
G01R 31/2884; G01R 31/318511; G01R
31/31905; G01R 1/07378; H01L 2924/14;
H01L 21/486; H01L 21/4885; H01L
2224/16; H01L 2225/06596; H01L 22/30;
H01L 23/481; H01L 23/49827; H01L
24/81; H01L 24/83; H01L 21/66; H01R
13/2464; H01R 2201/20
See application file for complete search history.

(56) References Cited

U.S. PATENT DOCUMENTS

| | | | | |
|---|---|---|---|---|
| 6,433,565 B1 * | 8/2002 | Desai | ............ | G01R 1/07371 |
| | | | | 324/756.02 |
| 7,345,492 B2 * | 3/2008 | Kister | ............ | G01R 1/07357 |
| | | | | 324/756.03 |
| 8,378,704 B2 * | 2/2013 | Itou | ............ | H05K 3/4614 |
| | | | | 324/756.03 |
| 8,729,684 B2 * | 5/2014 | Park | ............ | H05K 7/1053 |
| | | | | 257/678 |
| 2009/0167335 A1 | 7/2009 | Yamada et al. | | |
| 2010/0117673 A1 | 5/2010 | Lee et al. | | |
| 2013/0082728 A1 | 4/2013 | Wang | | |
| 2014/0176171 A1 * | 6/2014 | Choi | ............ | G01R 31/2889 |
| | | | | 324/750.16 |
| 2016/0109483 A1 | 4/2016 | Bohm et al. | | |

FOREIGN PATENT DOCUMENTS

| | | |
|---|---|---|
| JP | 2007127488 A | 5/2007 |
| JP | 2007178405 A | 7/2007 |
| JP | 2012112771 A | 6/2012 |
| JP | 2013080888 A | 5/2013 |
| JP | 2014122872 A | 7/2014 |
| JP | 2015118064 A | 6/2015 |
| JP | 2016522404 A | 7/2016 |
| KR | 20020014677 | 1/2004 |
| KR | 20080099057 A | 11/2008 |
| KR | 20140081291 A | 7/2014 |
| KR | 20160126395 A | 11/2016 |

* cited by examiner

| TERMINAL | REFERENCE EXAMPLE | EXAMPLE |
|---|---|---|
| GND | 680 | 230 |
| SIGNAL | 1450 | 1450 |
| FIRST POWER SUPPLY | 150 | 150 |
| SECOND POWER SUPPLY | 60 | 60 |
| THIRD POWER SUPPLY | 360 | 200 |
| FOURTH POWER SUPPLY | 570 | 220 |
| FIFTH POWER SUPPLY | 110 | 40 |
| TOTAL | 3380 | 2350 |

ELECTRICAL CONNECTION DEVICE WITH A SHORT-CIRCUIT WIRING PATTERN THAT REDUCES CONNECTION WIRINGS

TECHNICAL FIELD

The present invention relates to an electrical connection device for use in measuring electrical characteristics of an inspection object.

BACKGROUND ART

In order to measure electrical characteristics of an inspection object such as an integrated circuit in a state of a substrate, an electrical connection device including probes to be brought into contact with the inspection object is used. For the electrical connection device, there is used a configuration in which a probe head that holds probes is attached to an electrode substrate on which electrode pads electrically connecting to the probes are arranged, or the like.

An interval between the probes corresponds to an interval between inspecting pads arranged on the inspection object. In order to increase the interval between the electrode pads, which are arranged on the electrode substrate, more than the interval between the probes, there is used an electrical connection device having a configuration in which a space transformer is disposed between the probe head and the electrode substrate (for example, refer to PTL 1). On a main surface of the space transformer, which faces the probe head, terminals which connect to proximal end portions of the probes, are arranged. Meanwhile, on a main surface of the space transformer, which faces the electrode substrate, terminals which connect to the electrode pads of the electrode substrate, are arranged. The space transformer and the electrode substrate are electrically connected, for example, by conductive wires and the like. Hereinafter, such wires which connect the space transformer and the electrode substrate to each other will be referred to as "connection wires".

CITATION LIST

Patent Literature

PTL 1—Japanese Patent Laid-Open Publication No. 2007-178405

SUMMARY OF INVENTION

Technical Problem

With regard to the terminals which connect to the probes of the space transformer, the same number thereof as the number of probes is prepared. When the number of terminals of the space transformer, which connect to the electrode pads of the electrode substrate, is made the same as the number of probes in response to this, a variety of problems occur. For example, a resin that fixes the connection wires becomes difficult to flow onto a surface of the space transformer by the fact that there rises an integration degree of the connection wires which connect the space transformer and the electrode substrate to each other. Moreover, the number of connection wires increases as the number of probes increases, and manufacturing steps increase.

In consideration of the above-described problems, it is an object of the present invention to provide an electrical connection device capable of suppressing the number of connection wires which connect to the space transformer.

Solution to Problem

In accordance with an aspect of the present invention, there is provided an electrical connection device including: a plurality of probes in which distal end portions contact an inspection object during measurement; and a space transformer including a plurality of connection wirings, in each of which a first terminal electrically connected to any of proximal end portions of the plurality of probes is arranged on a first main surface, and a second terminal is exposed to a second main surface, and having a short-circuit wiring pattern formed on the first main surface, the short-circuit wiring pattern electrically connecting, to the same connection wiring, proximal end portions of a plurality of same-potential probes set at a same potential during measurement among the plurality of probes.

Advantageous Effects of Invention

In accordance with the present invention, the electrical connection device capable of suppressing the number of connection wires which connect to the space transformer can be provided.

DESCRIPTION OF EMBODIMENT

Figure 1:
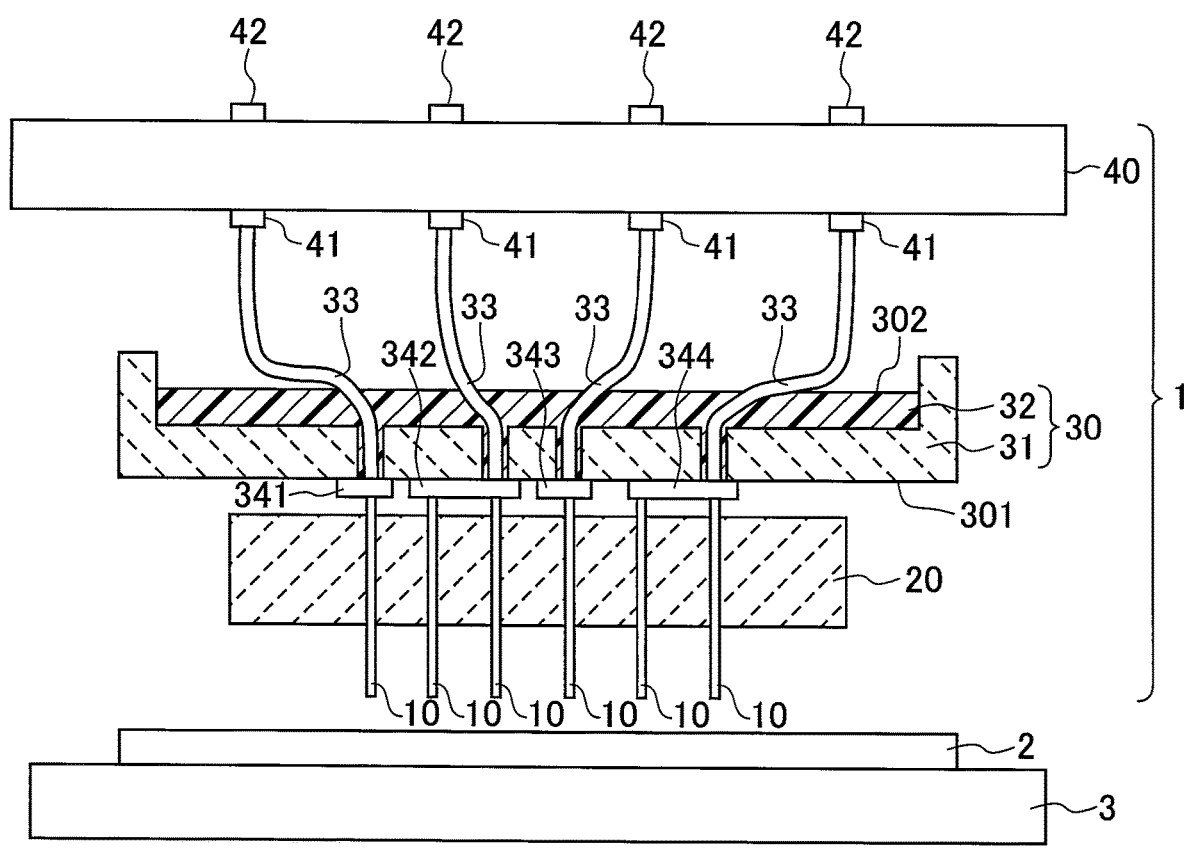
FIG. 1 is a schematic diagram illustrating a configuration of an electrical connection device according to an embodiment of the present invention.

Next, a description will be given of embodiments of the present invention with reference to the drawings. In the following description referring to the drawings, the same or similar reference numerals are assigned to the same or similar portions. However, it should be noted that the drawings are schematic, and that a ratio of thicknesses of respective portions, and the like are different from actual ones. Moreover, as a matter of course, also between the drawings, portions where dimensional relationship and ratio therebetween are different from each other are also included. The embodiments illustrated below are exemplifying a device and a method for embodying the technical idea of this invention, and the embodiments of this invention do not specify materials, shapes, structures, dispositions and the like of constituent components to those described below.

An electrical connection device 1 according to an embodiment of the present invention, which is illustrated in FIG. 1, is used for measuring electrical characteristics of an inspection object 2. The electrical connection device 1 includes: a probe head 20 that holds a plurality of probes 10; a space transformer 30 connected to the probes 10; and an electrode substrate 40 on which electrode pads 41 electrically connected to the probes 10 through the space transformer 30.

The electrical connection device 1 illustrated in FIG. 1 is a vertical operation-type probe card, in which distal end portions of the probes 10, which are exposed to a lower surface of the probe head 20, contact inspecting pads (not illustrated) of an inspection object 2, which are disposed below the electrical connection device 1. FIG. 1 illustrates a state where the probes 10 are not in contact with the inspection object 2; however, for example, a chuck 3 on which the inspection object 2 is mounted rises, and the distal end portions of the probes 10 contact the inspection object 2.

The electrode pads 41 of the electrode substrate 40 are electrically connected to connection pads 42, which are arranged on an upper surface of the electrode substrate 40, by internal wirings formed inside the electrode substrate 40. The connection pads 42 are electrically connected to an inspection device such as an IC tester (not illustrated). Predetermined voltage and current are applied through the probes 10 to the inspection object 2 by the inspection device. Then, signals output from the inspection object 2 are sent through the probes 10 to the inspection device, and the characteristics of the inspection object 2 are inspected.

As illustrated in FIG. 1, the space transformer 30 includes a plurality of connection wirings 33 which have conductivity and penetrate an inside thereof from a first main surface 301 facing the probe head 20 to a second main surface 302 facing the electrode substrate 40. First terminals of the connection wirings 33 are arranged on the first main surface 301 of the space transformer 30. Second terminals of the connection wirings 33 are exposed to the second main surface 302 of the space transformer 30.

Wiring patterns 341 to 344 which individually connect to the first terminals of the connection wirings 33 are arranged on the first main surface 301 of the space transformer 30. Hereinafter, the wiring patterns arranged on the first main surface 301 will be collectively referred to as a "wiring pattern 34". Proximal end portions of the probes 10 are in contact with the wiring pattern 34, and through the wiring pattern 34 having conductivity, the proximal end portions of the probes 10 and the first terminals of the connection wirings 33 are electrically connected to each other. For the wiring pattern 34, a metal film or the like is suitably used.

The individual second terminals of the connection wirings 33 are electrically connected to a plurality of the electrode pads 41 arranged on the electrode substrate 40. In the example illustrated in FIG. 1, the connection wirings 33 partially extend from the second main surface 302, and partially connect to the electrode pads 41. That is, the proximal end portions of the probes 10 and the electrode pads 41 are electrically connected to each other by the connection wirings 33. As described above, portions of the connection wirings 33, which extend from the second main surface 302, are used as the connection wires which electrically connect the space transformer 30 and the electrode substrate 40 to each other.

The space transformer 30 includes: a support substrate 31 in which through holes through which the connection wirings 33 pass are formed; and a resin layer 32 disposed on an upper surface of the support substrate 31. In the space transformer 30 illustrated in FIG. 1, a resin layer 32 is formed by embedding a resin in a recess formed on the upper surface of the support substrate 31, and the connection wirings 33 penetrate the resin layer 32 upward. That is, a lower surface of the support substrate 31 is the first main surface 301, and an upper surface of the resin layer 32 is the second main surface 302. For the support substrate 31, a ceramic substrate or the like is used.

For the connection wirings 33, conductive wires made of a metal material or the like are suitably used. One-side end portions of the conductive wires are the first terminals, and other-side end portions thereof are the second terminals. The connection wirings 33 having certain flexibility are used, whereby the connection wirings 33 are curved inside the resin layer 32 and between the space transformer 30 and the electrode substrate 40. Therefore, an interval at which the second terminals are arranged can be increased more than an interval at which the first terminals are arranged. Thus, an interval for arranging the electrode pads 41 of the electrode substrate 40 can be increased. Hence, connection work such as wire bonding for electrically connecting the space transformer 30 and the electrode substrate 40 to each other becomes easy. The space transformer 30 is particularly effective when the interval between the probes 10 is narrow.

In the electrical connection device 1 illustrated in FIG. 1, the wiring pattern 34 (hereinafter, referred to as "short-circuit wiring pattern") that electrically connects, to one another, a plurality of the probes 10 (hereinafter, referred to as "same-potential probes") set at the same potential during measurement of the inspection object 2 is formed on the first main surface 301 of the space transformer 30. In the example illustrated in FIG. 1, a wiring pattern 342 and a wiring pattern 344 are the short-circuit wiring patterns. Therefore, the number of connection wirings 33 is smaller than the number of probes 10 which connect to the space transformer 30.

For example, the wiring patterns 34 which connect to a plurality of the probes 10 individually connecting to ground (GND) terminals of the inspection object 2 are short-circuited, and one short-circuit wiring pattern is formed. Then, one connection wiring 33 that electrically connects to this short-circuit wiring pattern is prepared. Thus, the number of connection wirings 33 can be reduced.

The number and arranging positions of such short-circuit wiring patterns formed on the first main surface 301 of the space transformer 30 are arbitrarily settable. For example, not only the probes 10 set at the GND potential but also a plurality of the probes 10 which individually connect to same-potential power supply terminals of the inspection object 2 can be short-circuited as the same-potential probes by such a short-circuit wiring pattern. Moreover, when there are a plurality of types in the potential of the power supply, the short-circuit wiring patterns can be formed for the power supply terminals at the respective potentials.

Note that, when the same-potential probes 10 are connected to the first main surface 301 apart from one another, the same-potential probes 10 close to one another may be grouped, and the short-circuit wiring patterns may be formed individually for a plurality of groups. Thus, there can be suppressed an increase of an area of the first main surface 301, which results from the fact that an area of the short-circuit wiring pattern is increased since the same-potential probes 10 arranged apart from one another are short-circuited. For example, only the adjacent same-potential probes can be short-circuited by one short-circuit wiring pattern.

Figure 2:
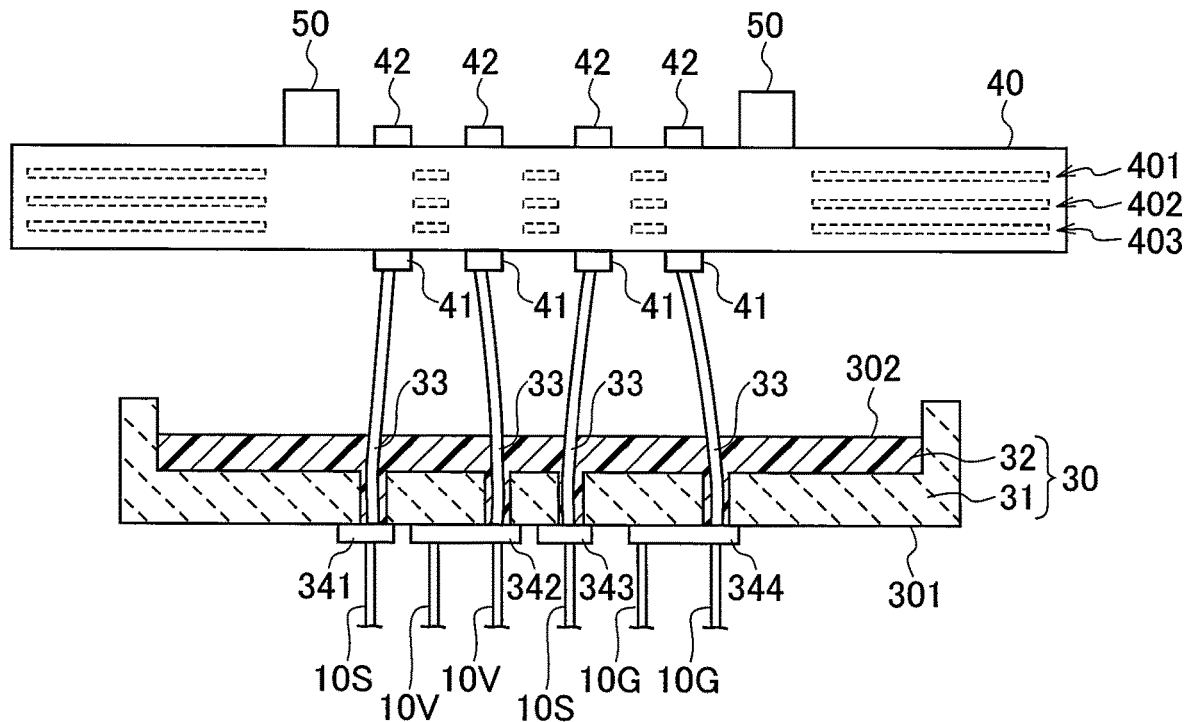
FIG. 2 is a schematic diagram illustrating a configuration of a space transformer and an electrode substrate in the electrical connection device according to the embodiment of the present invention.

FIG. 2 illustrates a configuration example of a short-circuit wiring pattern. In the example illustrated in FIG. 2, the probes 10 which connect to the GND terminals of the inspection object 2 are illustrated as GND probes 10G, the probes 10 which connect to the power supply terminals are illustrated as power supply probes 10V, and probes 10 which connect to signal terminals are illustrated as signal probes 10S (the same applies below). On the first main surface 301 of the space transformer 30, two GND probes 10G are short-circuited by a wiring pattern 344 as the short-circuit wiring patterns, and two power supply probes 10V are short-circuited by a wiring pattern 342 as the short-circuit wiring pattern. Therefore, the number of connection wirings 33 is smaller than the number of probes 10.

Figure 3:
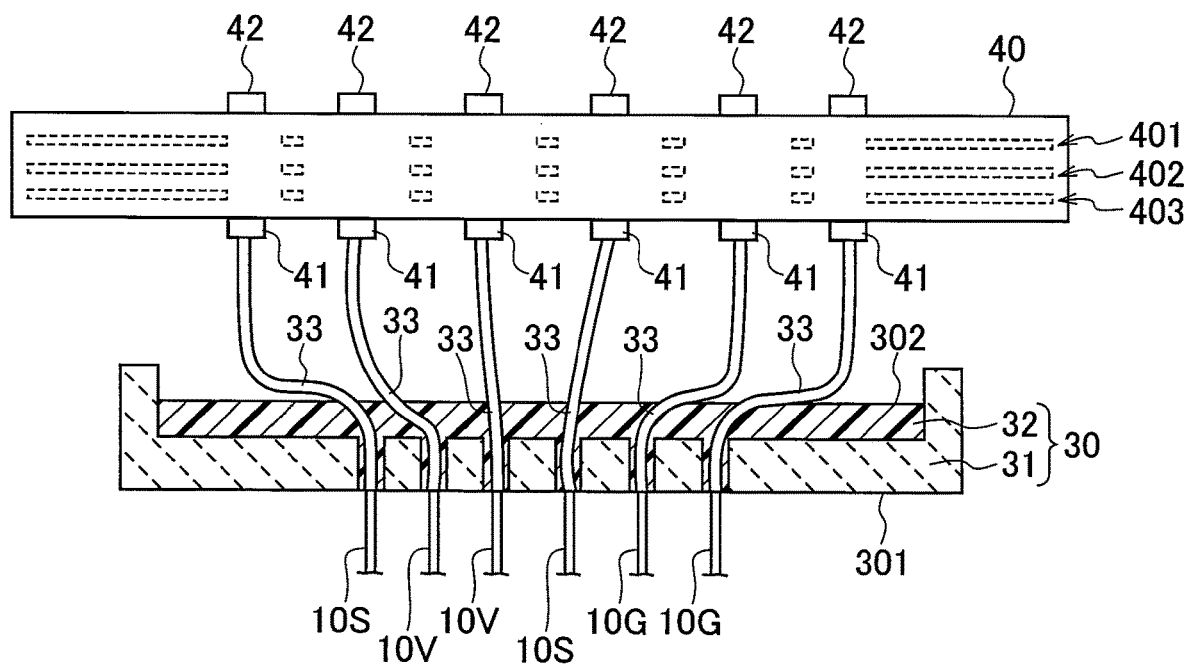
FIG. 3 is a schematic diagram illustrating a configuration of a space transformer and an electrode substrate in a comparative example.

In contrast, in a space transformer 30A of a comparative example, which is illustrated in FIG. 3, the GND probes 10G and the power supply probes 10V are individually connected to the first terminals of the connection wirings 33 different from one another. That is, the number of probes 10 and the number of connection wirings 33 are the same.

In the space transformer 30 illustrated in FIG. 2, the first terminals are arranged on the first main surface 301 in a similar layout to that of an array of the probes 10 as in the comparative example illustrated in FIG. 3. However, the short-circuit wiring pattern is formed as described above, whereby the number of connection wirings 33 which connect the space transformer 30 and the electrode substrate 40 to each other can be reduced. That is, the number of connection wires which electrically connect the space transformer 30 and the electrode substrate 40 to each other can be reduced. Therefore, the manufacturing steps are reduced, and manufacturing cost of the electrical connection device 1 can be suppressed.

Moreover, the number of connection wirings 33 is reduced, whereby the number of electrode pads 41 of the electrode substrate 40 and the number of connection pads 42 thereof can be reduced. Therefore, as illustrated in FIG. 2, a region where electronic components 50 are disposed can be ensured on the upper surface of the electrode substrate 40. For example, a capacitor, a resistor and the like can be disposed on the upper surface of the electrode substrate 40.

Figure 4:
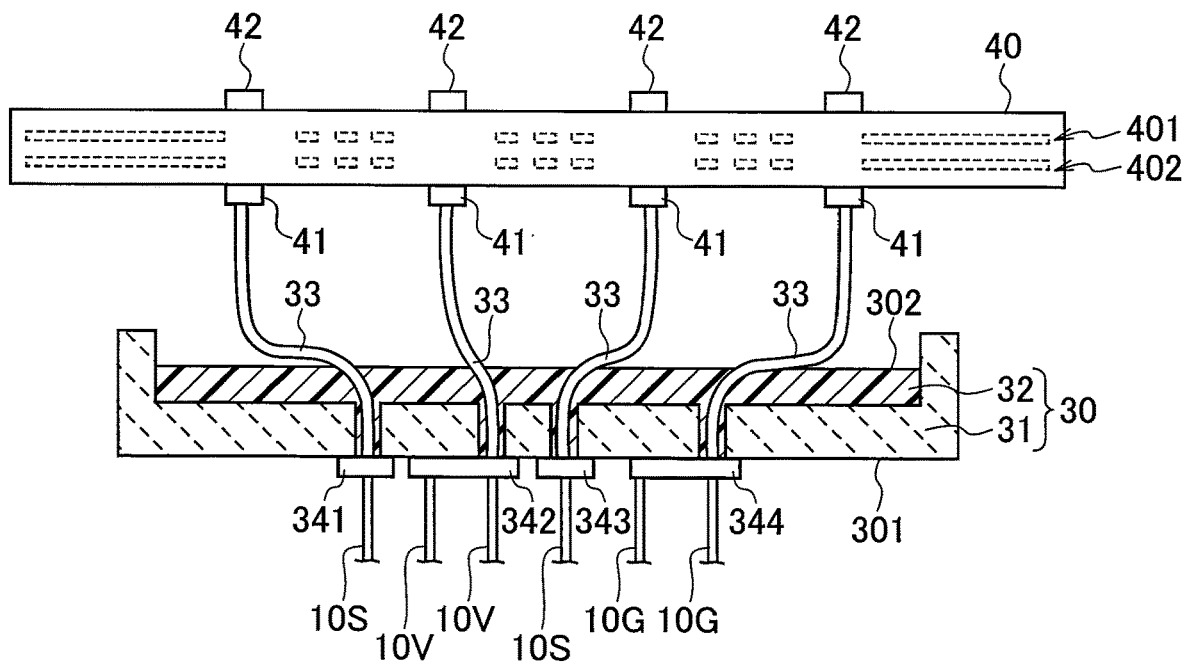
FIG. 4 is a schematic diagram illustrating another configuration of the space transformer and the electrode substrate in the electrical connection device according to the embodiment of the present invention.

Moreover, the number of electrode pads 41 of the electrode substrate 40 and the number of connection pads 42 thereof can be reduced, whereby the internal wirings of the electrode substrate 40, which connect the electrode pads 41 and the connection pads 42 to each other, decrease. For example, in the comparative example illustrated in FIG. 3, three wiring layers 401 to 403 are formed inside the electrode substrate 40 for the internal wirings. In contrast, the number of electrode pads 41 and the number of connection pads 42 are reduced, whereby there increases a degree of freedom in layout of the electrode pads 41 and the connection pads 42. Therefore, as illustrated in FIG. 4 it is possible to reduce the number of layers of the internal wirings of the electrode substrate 40 to two layers which are the wiring layers 401 and 402. The number of wiring layers is reduced, whereby the manufacturing cost can be reduced.

Moreover, the number of connection wirings 33 is reduced, whereby a density of the connection wires decreases between the space transformer 30 and the electrode substrate 40. Therefore, in the manufacturing steps of the electrical connection device 1, a resin for forming the resin layer 32 is easy to flow onto the upper surface of the support substrate 31. In contrast, when the density of the connection wires is high, and the resin is difficult to flow onto the upper surface of the support substrate 31, unevenness is formed in a region where the resin layer 32 is formed. In that case, the connection wires are not fixed sufficiently, so that the connection wires contact peripheries thereof, and foreign objects adhere to portions on the upper surface of the support substrate 31, the portions allowing exposure of the connection wires therefrom. As a result, the connection wires are short-circuited, and the connection wires are damaged, whereby the characteristics and reliability of the electrical connection device decrease.

In the space transformer 30 of the electrical connection device 1, such problems as described above do not occur. Hence, manufacturing yield and reliability of the electrical connection device 1 can be suppressed from decreasing.

Hereinafter, referring to FIG. 5 to FIG. 9, a description will be given of an example of the method for manufacturing the space transformer 30 of the electrical connection device 1 according to the embodiment of the present invention. Note that the manufacturing method, which will be mentioned below, is merely an example, and as a matter of course, the electrical connection device is achievable by a variety of manufacturing methods other than this mentioned method, the manufacturing methods including modified examples thereof.

Figure 5:
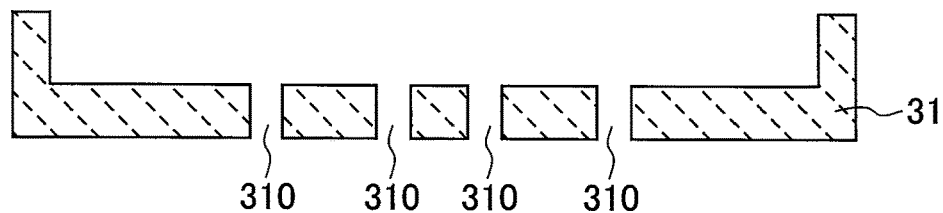
FIG. 5 is a schematic diagram for explaining a method for manufacturing the space transformer of the electrical connection device according to the embodiment of the present invention (No. 1).
Figure 6:
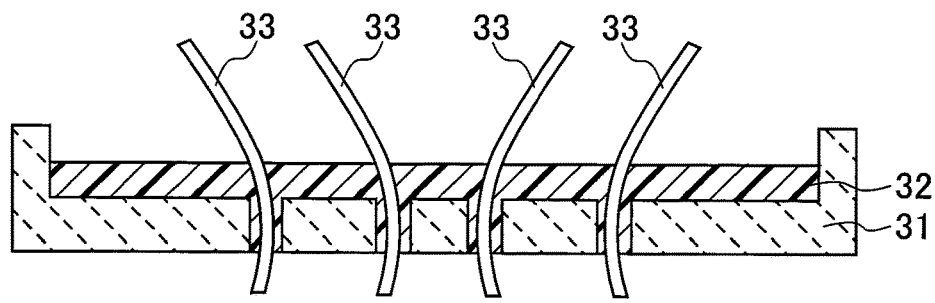
FIG. 6 is a schematic diagram for explaining the method for manufacturing the space transformer of the electrical connection device according to the embodiment of the present invention (No. 2).

First, as illustrated in FIG. 5, the support substrate 31 in which through holes 310 are formed is prepared, the through holes 310 allowing the connection wirings 33 to be arranged therein. Then, after the connection wirings 33 are inserted into the through holes 310, the resin is flown onto the upper surface of the support substrate 31 as illustrated in FIG. 6. The resin hardens, so that the resin layer 32 is formed, whereby positions of the connection wirings 33 are fixed on the second main surface 302.

Figure 7:
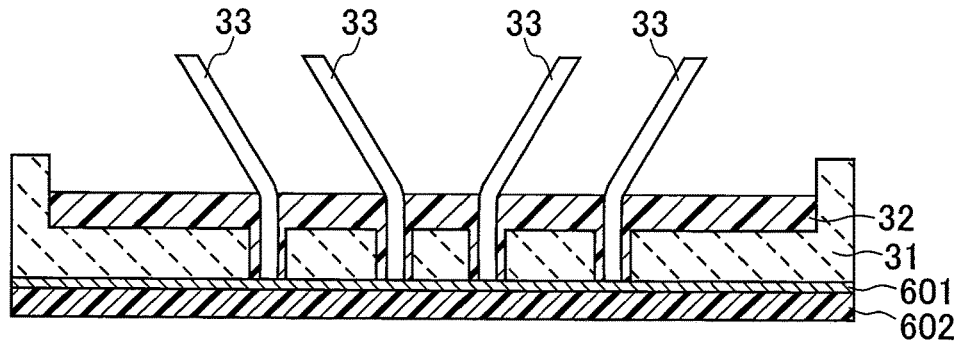
FIG. 7 is a schematic diagram for explaining the method for manufacturing the space transformer of the electrical connection device according to the embodiment of the present invention (No. 3).
Figure 8:
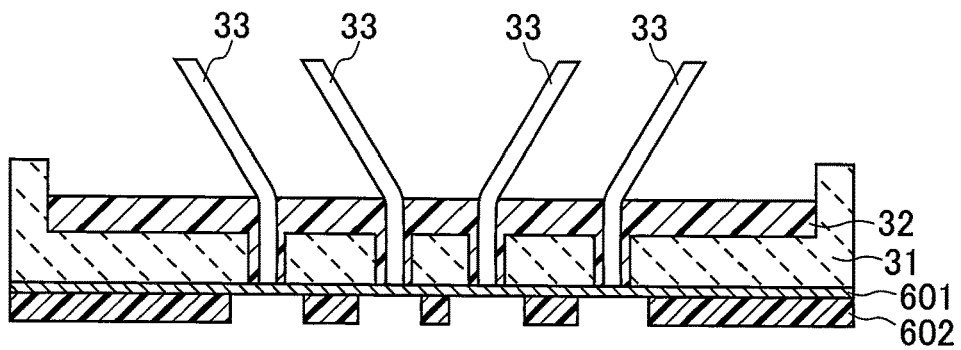
FIG. 8 is a schematic diagram for explaining the method for manufacturing the space transformer of the electrical connection device according to the embodiment of the present invention (No. 4).

Thereafter, the connection wirings 33 are cut on the first main surface 301, and thereafter, as illustrated in FIG. 7, a metal film 601 is formed on the first main surface 301 by a sputtering method or the like, and further, a photoresist film 602 is formed thereon. Then, the photoresist film 602 is patterned as illustrated in FIG. 8 by exposure and development, and the metal film 601 is exposed in regions where the first terminals of the connection wirings 33 are arranged.

Figure 9:
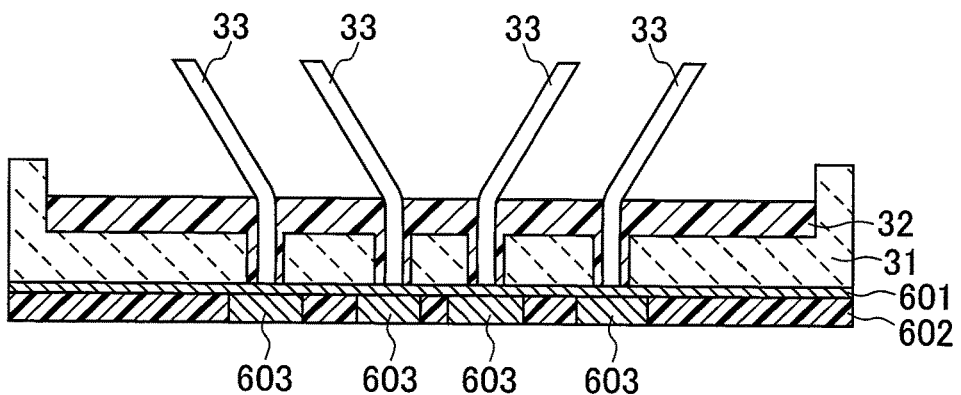
FIG. 9 is a schematic diagram for explaining the method for manufacturing the space transformer of the electrical connection device according to the embodiment of the present invention (No. 5).

Subsequently, as illustrated in FIG. 9, plating layers 603 are formed on exposed surfaces of the metal film 601. Thereafter, the photoresist film 602 is removed, and the metal film 601 in excess regions is removed by sputter etching or the like, whereby the wiring pattern 34 is formed in a predetermined region.

As described above, it is possible to easily form the wiring pattern 34, which includes the short-circuit wiring pattern, on the first main surface 301 of the space transformer 30 by using a photolithography technique or the like.

As described above, in accordance with the electrical connection device 1 according to the embodiment of the present invention, the same-potential probes are short-circuited by the short-circuit wiring pattern, whereby the number of connection wirings 33 can be made smaller than the number of probes 10. Therefore, the number of connection wires which connect to the electrode substrate 40 can be suppressed. Moreover, the density of the connection wires can be lowered.

Hence, in accordance with the electrical connection device 1, man-hour in manufacturing the electrical connection device 1 can be reduced, and in addition, the manufacturing yield thereof can be increased. As a result, manufacturing cost is suppressed. Moreover, the number of connection wires is reduced, whereby the electrical connection device 1 can also deal with an inspection in which the number of probes 10 is large in order to inspect such an inspection object 2 of which pins are increased.

Figures 10, 11:
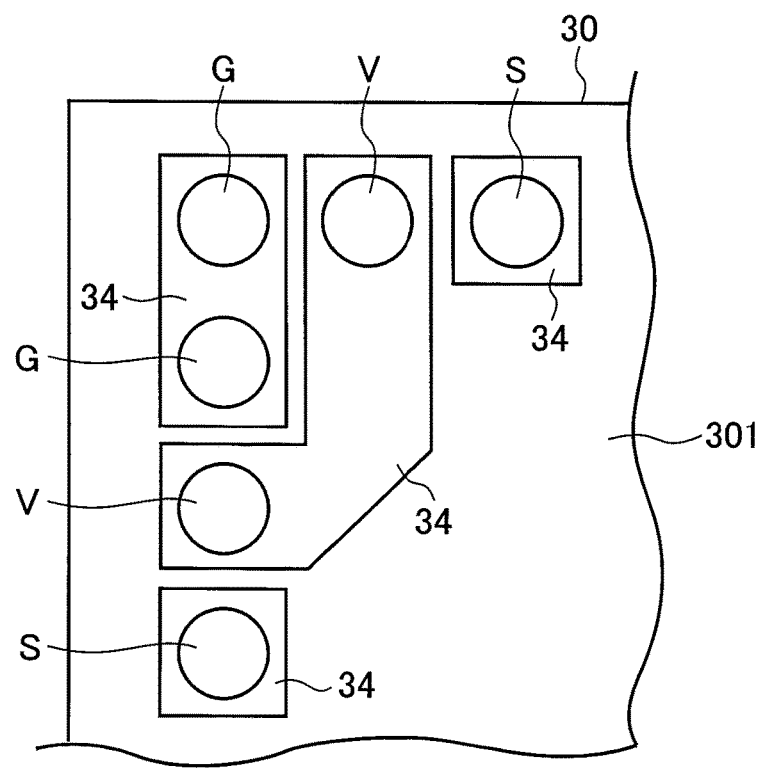
FIG. 10 is a table showing an example where the number of connection wires is reduced by the electrical connection device according to the embodiment of the present invention.
FIG. 11 is a schematic plan view illustrating an example of a wiring pattern of an electrical connection device according to another embodiment of the present invention.

FIG. 10 illustrates an example where, with regard to such an inspection object 2 including five types of power supply terminals, the number of connection wires is reduced by the electrical connection device 1 according to the embodiment of the present invention. A reference example in FIG. 10 is an example in a case where the connection wirings 33 are caused to individually correspond to the probes 10. In the example of FIG. 10, the short-circuit wiring pattern was disposed, whereby the number of connection wirings 33 is reduced for the GND terminals and the third to five power supply terminals. Note that, for the first power supply terminals and the second power supply terminals, the connection wirings 33 were not reduced by using the short-circuit wiring pattern. The connection wirings 33 are reduced, whereby the connection wires are reduced. As shown in FIG. 10, in the example, 1,030 connection wires can be reduced in comparison with the comparative example.

Other Embodiments

As above, the present invention has been described by the embodiments; however, it should not be understood that the description and the drawings, which form a part of this disclosure, limit the present invention. For those skilled in the art, varieties of alternative embodiments, examples and application technologies will be obvious from this disclosure.

For example, in the above, an example where one connection wiring 33 is connected to one short-circuit wiring pattern is shown. However, a plurality of the connection wirings 33 may be connected to one short-circuit wiring pattern. For example, two connection wirings 33 may be connected to a short-circuit wiring pattern that short-circuits five same-potential probes. That is, the number of connection wirings 33 which connect to the same-potential probes can be set in response to a total value of currents which flow through the same-potential probes.

Moreover, in FIG. 1 and the like, the case where the same-potential probes are adjacent to each other is illustratively shown. However, for example as illustrated in FIG. 11, the same-potential probes arranged apart from each other may be short-circuited by the short-circuit wiring pattern. FIG. 11 illustrates positions where the proximal end portions of the probes 10 connect to the space transformer 30 when the power supply terminals at the same potential are arranged apart from each other in the inspection object 2.

FIG. 11 is a plan view of the first main surface 301 on which the wiring pattern 34 is arranged, in which positions of proximal end portions of the GND probes 10G which connect to the GND terminals, of the power supply probes 10V which connect to the power supply terminals and of the signal probes 10S which connect to the signal terminals are respectively indicated by reference symbols G, V and S. As illustrated in FIG. 11, the power supply probes 10V which are not arranged adjacent to each other can be short-circuited by the short-circuit wiring pattern.

As described above, it is natural that the present invention incorporates a variety of embodiments which are not described herein.

INDUSTRIAL APPLICABILITY

The electrical connection device of this embodiment is applicable to the characteristic measurement field of objects to be inspected.

What is claimed is:

1. An electrical connection device for use in measuring electrical characteristics of an inspection object, comprising:
a plurality of probes in which distal end portions contact the inspection object during measurement; and
a space transformer including:
a plurality of connection wirings, each having a first terminal arranged on a first main surface of the space transformer, and each having a second terminal exposed relative to a second main surface of the space transformer, the first terminal connected to a proximal end portion of at least one of the plurality of probes; and
a short-circuit wiring pattern formed on the first main surface, the short-circuit wiring pattern electrically connecting proximal end portions of at least two of the plurality of probes to a common one of the plurality of connection wirings, such that during measurement the at least two of the plurality of probes are set at a same voltage potential using the common one of the plurality of connection wirings.

2. The electrical connection device according to claim 1, wherein the short-circuit wiring pattern connects a plurality of the adjacent same-potential probes to each other.

3. The electrical connection device according to claim 1, wherein there are a plurality of the connection wirings which electrically connect to the single short-circuit wiring pattern.

4. The electrical connection device according to claim 1, wherein an interval between the second terminals is wider than an interval between the first terminals.

5. The electrical connection device according to claim 1, further comprising an electrode substrate having a plurality of electrode pads arranged thereon, the electrode pads being individually and electrically connected to a plurality of the second terminals.

6. The electrical connection device according to claim 5, wherein the proximal end portions of the probes and the electrode pads are electrically connected by portions of the connection wirings, the portions extending from the second main surface.

7. The electrical connection device according to claim 1, wherein the connection wirings are conductive wires having flexibility.

8. The electrical connection device according to claim 1, wherein the space transformer has a configuration in which a resin layer is disposed on a support substrate, and positions of the connection wirings are fixed on the second main surface by the resin layer.

\* \* \* \* \*